(12) United States Patent  (10) Patent No.: US 8,462,487 B2
Matthews et al.  (45) Date of Patent: Jun. 11, 2013

(54) ESS WITH INTEGRATED DC/DC CONVERTER AND HYBRID POWER ELECTRONICS

(75) Inventors: Derek Matthews, Vestal, NY (US); Filippo Muggeo, Endwell, NY (US); Jurgen Schulte, Vestal, NY (US); Brendan Pancheri, Binghamton, NY (US); Dan Snavely, Binghamton, NY (US)

(73) Assignee: BAE Systems Controls Inc., Johnson City, IA (US)

( * ) Notice: Subject to any disclaimer, the term of this patent is extended or adjusted under 35 U.S.C. 154(b) by 266 days.

(21) Appl. No.: 12/949,355

(22) Filed: Nov. 18, 2010

(65) Prior Publication Data

US 2012/0127638 A1   May 24, 2012

(51) Int. Cl.
*H05K 7/20* (2006.01)
(52) U.S. Cl.
USPC ........... 361/677; 361/676; 361/688; 361/689; 361/704; 361/707
(58) Field of Classification Search
None
See application file for complete search history.

(56) References Cited

U.S. PATENT DOCUMENTS

| | | | | |
|---|---|---|---|---|
| 6,867,970 | B2 * | 3/2005 | Muller et al. | 361/695 |
| 6,960,842 | B2 * | 11/2005 | Ziegler et al. | 307/64 |
| 7,139,170 | B2 * | 11/2006 | Chikusa et al. | 361/695 |
| 7,272,002 | B2 * | 9/2007 | Drapeau | 361/679.48 |
| 7,308,958 | B2 | 12/2007 | Tamor et al. | |
| 7,641,490 | B2 * | 1/2010 | Korich et al. | 439/196 |
| 7,808,775 | B2 * | 10/2010 | Cherney et al. | 361/624 |
| 2005/0082095 | A1 | 4/2005 | Tamai et al. | |
| 2006/0039108 | A1 * | 2/2006 | Chikusa et al. | 361/695 |
| 2006/0097575 | A1 | 5/2006 | Xu et al. | |
| 2008/0142282 | A1 | 6/2008 | Bartilson | |
| 2008/0143301 | A1 | 6/2008 | Bartilson | |
| 2008/0223632 | A1 | 9/2008 | Bartilson | |
| 2008/0266090 | A1 | 10/2008 | Egan et al. | |
| 2009/0139781 | A1 | 6/2009 | Straubel | |

FOREIGN PATENT DOCUMENTS

JP   2008-312404   12/2008

* cited by examiner

*Primary Examiner* — Boris Chervinsky
(74) *Attorney, Agent, or Firm* — Paul J. Esatto; Scully Scott Murphy & Presser, PC

(57) ABSTRACT

A power system for connecting high voltage components includes an enclosure having an interior space. A plurality of high voltage (HV) components are removably coupled to the enclosure and positioned in the interior space of the enclosure. The plurality of HV components are electrically coupled to each other. A motor is positioned outside the enclosure, and the motor is electrically interconnected through the enclosure to one of the HV components. A heat sink is positioned within the interior space for providing thermal heat transfer away from the components.

14 Claims, 2 Drawing Sheets

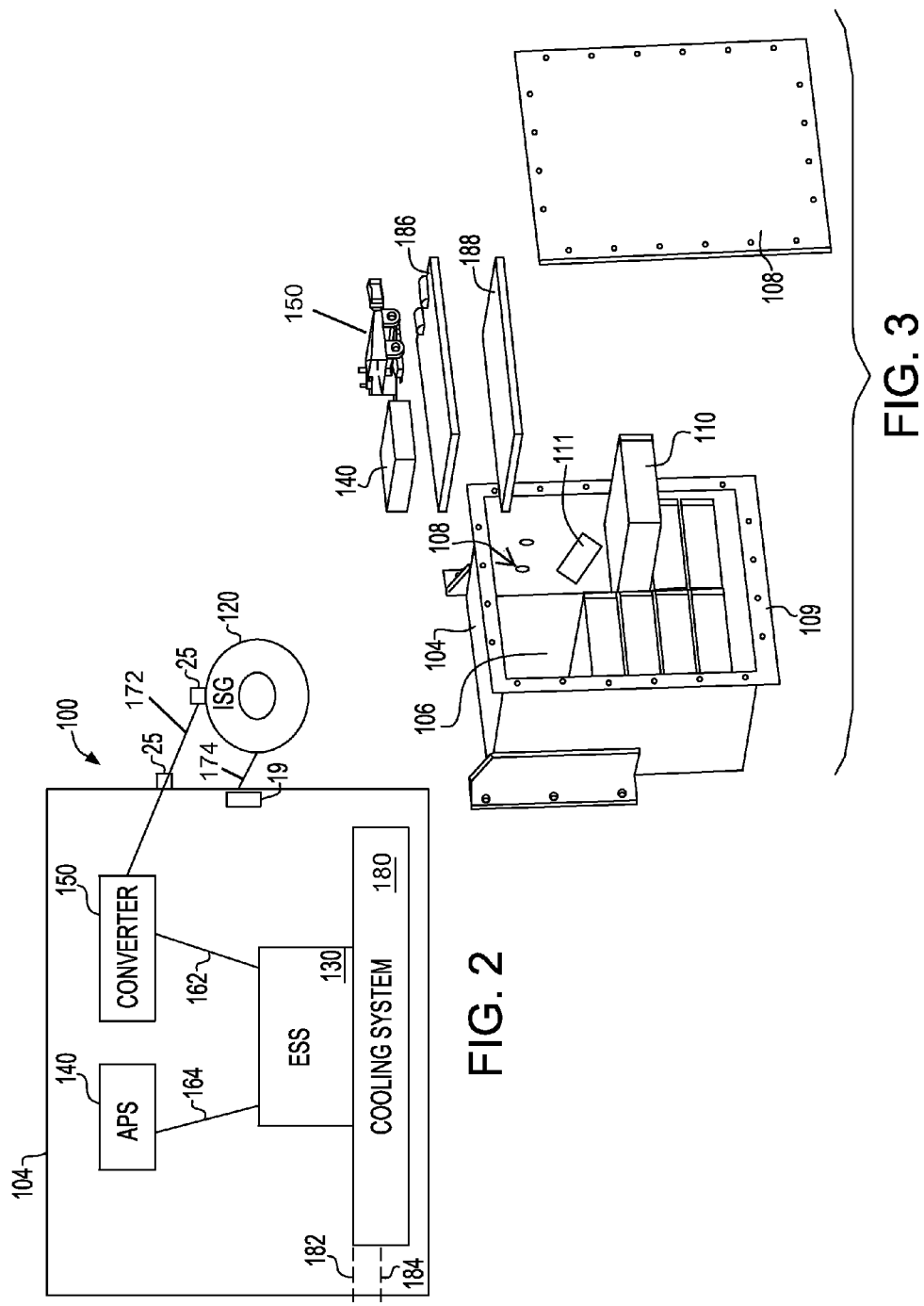

ESS WITH INTEGRATED DC/DC CONVERTER AND HYBRID POWER ELECTRONICS

BACKGROUND OF THE INVENTION

1. Field of the Invention

The present invention generally relates to a power system for connecting electrical components, and more particularly, the present invention relates to a power system for connecting high voltage components including an energy storage system.

2. Description of Related Art

Known power systems may include energy storage devices and systems, which may include high voltage components. For example, a hybrid electric vehicle (HEV) may include an electric energy storage system. The electric energy storage system can provide electric power for powering a motor. The motor converts electric power to mechanical power for driving the vehicle. The electric energy storage system can be a battery, a capacitor, a combination of the two, or some other device capable of storing and discharging electric energy.

Referring to FIG. 1, a prior art energy storage or power system 10 for providing power to a motor/generator 20 includes multiple components each having its own enclosure, and individual connections for power, control, and cooling. For example, the system 10 includes a converter 14 (also may be referred to as an inverter) in an enclosure 15 having a converter high voltage (HV) connection 16 to a motor 20 (also referred to as an integrated starter generator motor (ISG)) using connection elements 25. The HV connection may be a 3 phase HV AC connection. The HV connection and connection elements may also include an HV wire/harness with a HV cable feed having pins and sockets for connecting to multiple components. A converter interlock low voltage (LV) connection 18 is connected to both the converter 14 and the motor 20. The LV connection may be a LV cable connected to a control card 19 for managing the HV connection, e.g., detecting continuity or a circuit or electrical loop for checking that the HV wire/harness is connected before enabling power to the HV pins in a HV cable feed with pins and sockets. The converter 14 is connected to an energy storage system (ESS) 30 in enclosure 31 via an ESS high voltage connection 32 with connection elements 25. The converter 14 is also connected to the ESS 30 with an ESS LV connection 34. The ESS high voltage connection may be a HV DC connection. The ESS 30 may include, for example, a plurality of batteries. An auxiliary power system 40 (APS) in enclosure 41 is also connected to the ESS 30 via an APS HV connection 42 with connection elements 25, for example, a HV DC connection. The APS 40 is also connected to the ESS 30 with an APS LV connection 44. The APS 40 may also be referred to as a DC/DC converter. Further, each of the components includes a cooling system, for example, each of the components may be separately connected to a central cooling system (not shown), or each of the components may be connected to and have its own heat sink. For example, fluid conduits for cooling the components are connected to the cooling system and include a conduit 58 between the converter 14 and the ESS 30. A conduit 56 is between the converter 14 and the APS 40. Conduits 52 and 54 extend from the APS and the ESS 54, respectively, for connection to the cooling system.

It would therefore be desirable to provide a power system which reduces the complexity of a high voltage power system which includes HV components and energy storage devices. Further, there is a need in the art to reduce the number of HV interconnections, cooling devices, and cooling interconnections to and from each of the HV components. It would further be desirable to provide a power system which reduces exposure of HV components to environmental conditions.

SUMMARY OF THE INVENTION

In an aspect of the invention, a power system for connecting high voltage components includes an enclosure defining an interior space. A plurality of high voltage (HV) components are removably coupled in the interior space of the enclosure. The plurality of HV components are electrically coupled to each other. A motor is positioned outside the enclosure, and the motor is electrically interconnected through the enclosure to one of the HV components. A heat sink is positioned within the interior space for providing thermal heat transfer away from the components.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 2 is a schematic block diagram of a power system with an enclosure according to an embodiment of the invention; and FIG. 3 is a isometric view of the power system and enclosure shown in FIG. 2.

DETAILED DESCRIPTION OF THE INVENTION

Figure 1:
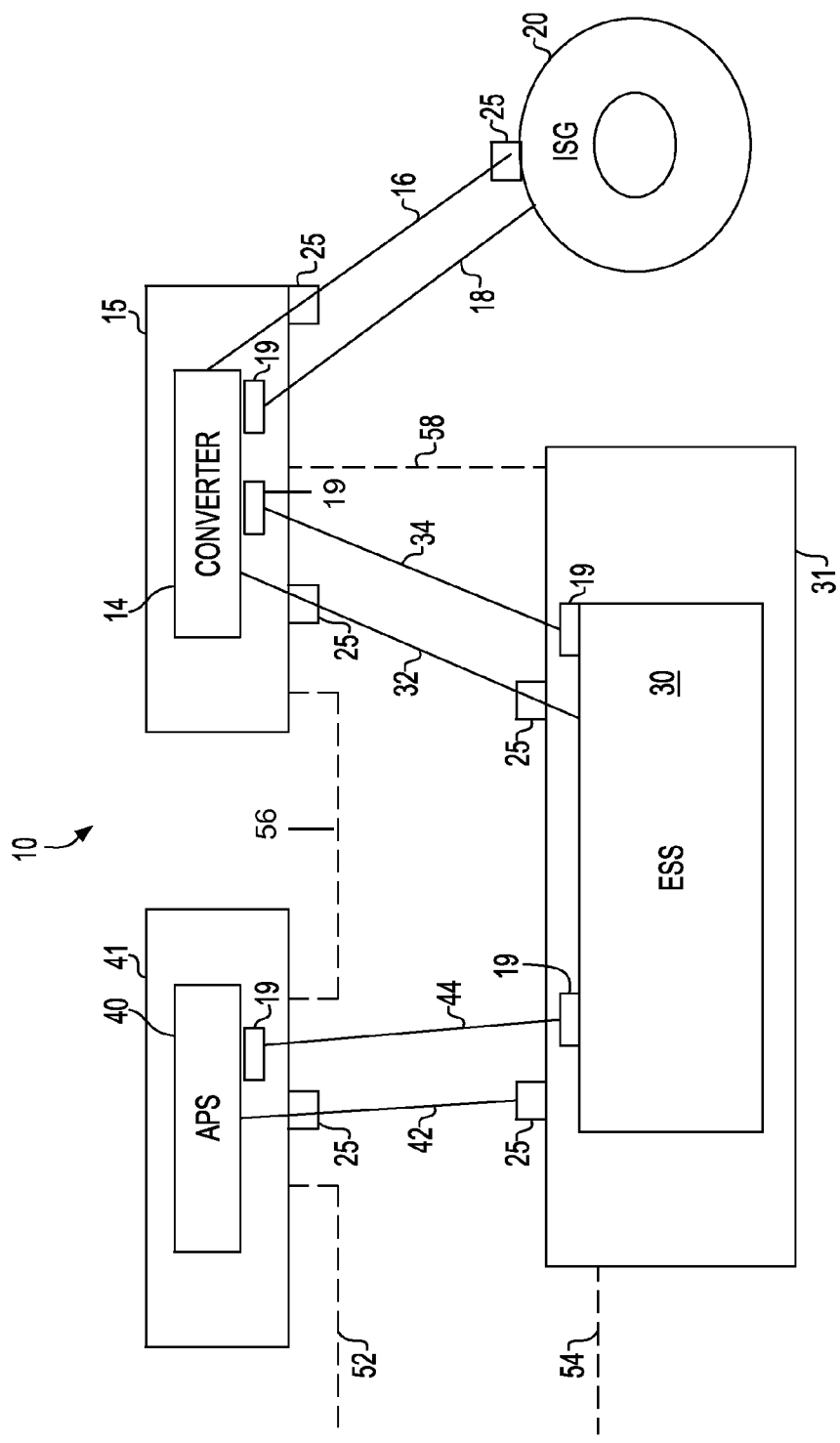
FIG. 1 is a schematic block diagram of a prior art power system.

Referring to FIGS. 2 and 3, an energy or power system 100 according to an embodiment of the invention provides power to a motor/generator 120, and includes multiple components in an enclosure 104. The enclosure 104 includes an interior 106 configured to house individual HV components, for example, using one or more coupling devices 111 attached to an inner wall of the enclosure 104. The HV components include a plurality of battery modules 110 (as shown in FIG. 3) which comprise an energy storage system (ESS) 130 (as shown in FIG. 2). Other HV components include an auxiliary power system (APS) 140 and a converter 150. A removable panel 108 (which, for example, may also be a door or faceplate) attaches to a flange 109 of the enclosure 104 to environmentally seal the enclosure 104. Environmental conditions may include water submersion, and heat. The interior 106 of the enclosure 104 may be configured to include racks or attachment mechanisms to hold each of the battery modules 110 in a removable, slide in and slide out, manner.

An HV connection, embodied as a cable 172, includes connection elements 25 at the motor/generator 120 and the enclosure 104. The cable 172 electrically connects the converter 150 inside the enclosure 104 with the motor/generator 120. The connection elements 25 may be sealed for exposure to environmental conditions, such as water or heat. An interlock LV cable 174 is connected to the motor/generator 120 and a control card 19 in the enclosure 104. The control card 19 detects continuity, or a circuit or electrical loop, in the connections, and thereby allows checking that the HV cable 172 is connected before enabling power via the HV cable 172. The connection elements 25 may include a combination of mating HV pins and sockets for connecting the cable 172. The HV connection may be a three phase HV AC connection. The enclosure 104, as shown in the embodiment of the invention depicted in FIG. 2, includes the ESS 130, the APS 140, and the converter 150. A first interior connection 162 connects the converter 150 and the ESS 130, and a second interior connection 164 connects the APS 140 and the ESS 130. The first and second interior connections 162, 164 are shorter than if the APS, ESS, and converter were not in the same enclosure 104. A further advantage of the system 100 is that the interlock LV connections are eliminated within the enclosure 104. Additionally, the first and second interior connections 162, 164 are not exposed to environmental conditions as the HV and LV connections outside the enclosure 104. Thus, the first and second interior connections 162, 164 do not need to be environmentally sealed, as exterior connections and connection elements. Further, in another embodiment of the invention, a bussing system (which may include a busbar) may be used to provide a connection between the converter, APS and ESS inside the enclosure.

A cooling system 180 is also positioned in the enclosure 104 to provide heat transfer away from the components. The cooling system 180 is connected to input and output conduits 182, 184, respectively for transporting cooling fluid. Referring to FIG. 3, the cooling system 180 may be embodied as upper and lower cold plates 186, 188. The cold plates 186, 188 may be positioned over and under top and bottom components in the enclosure 104, and connect to the input and output conduits 182, 184 through the enclosure 104.

In operation, the system 100 provides power to the motor 120 from the converter 150. The converter 150 converts direct current (DC) from the ESS 130, to alternating current (AC) current. The APS 140 is also connected to the ESS 130 for providing auxiliary power when needed. The cooling system 180 provides temperature maintenance of the components in the enclosure 104. The system 100 of the present invention, eliminates LV interlock connections, as well as, high voltage connections which are exposed to environmental conditions.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A power system for connecting high voltage components, the power system comprising:
   an enclosure defining an interior space;
   a plurality of high voltage (HV) components being removably coupled to the enclosure in the interior space of the enclosure, the plurality of HV components being electrically coupled to each other, the HV components including an energy storage system (ESS) component and at least one component other than an ESS;
   a motor positioned outside the enclosure, the motor being electrically interconnected through the enclosure to one of the HV components; and
   a heat sink within the interior space providing thermal heat transfer away from the components.

2. The system of claim 1, further comprising:
   an HV connection including HV connection elements connecting the motor and a converter as one of the plurality of HV components.

3. The system of claim 2, further comprising:
   a low voltage (LV) interlock connection between the motor and a control element positioned in the interior space of the enclosure for detecting a circuit continuity, wherein the circuit includes the HV connection.

4. The system of claim 1, wherein:
   the plurality of HV components include an auxiliary power system (APS) and a converter; and
   the ESS includes a plurality of battery modules.

5. The system of claim 1, further comprising:
   means for interconnecting the heat sink to a cooling system outside the enclosure for cooling the components in the interior space.

6. The system of claim 1, wherein the heat sink is connected through the enclosure to ingress and egress cooling lines outside the enclosure for providing a cooling fluid to the heat sink.

7. The system of claim 1, wherein the enclosure includes a removable front panel.

8. A method for connecting high voltage components, the method comprising:
   providing an enclosure defining an interior space;
   removably coupling a plurality of high voltage (HV) components to the enclosure in the interior space of the enclosure;
   electrically coupling the plurality of HV components to each other, the HV components including an energy storage system (ESS) component and at least one component other than an ESS;
   positioning a motor outside the enclosure and electrically interconnecting the motor through the enclosure to one of the HV components; and
   positioning a heat sink within the interior space for providing thermal heat transfer away from the components.

9. The method of claim 8, further comprising:
   interconnecting the heat sink to a cooling system outside the enclosure for cooling the components in the interior space.

10. An enclosure for connecting high voltage components, the enclosure comprising:
    an enclosure defining an interior space;
    coupling devices positioned in the interior space for receiving a plurality of high voltage (HV) components in the interior space of the enclosure, the plurality of HV components being electrically coupled to each other, the HV components including an energy storage system (ESS) component and at least one component other than an ESS;
    at least one aperture defined by the enclosure for electrically interconnecting a motor positioned outside the enclosure to one of the HV components through the aperture; and
    a heat sink positioned within the interior space for providing thermal heat transfer away from the components.

11. The enclosure of claim 10, further comprising:
    a control element positioned in the interior space of the enclosure, the control element being connected to a low voltage (LV) interlock cable being connected to the motor, wherein the control element detects a circuit continuity and the circuit includes the HV connection.

12. The enclosure of claim 10, wherein:
    the plurality of HV components include an auxiliary power system (APS) and a converter; and
    the ESS includes a plurality of battery modules.

13. The enclosure of claim 10, further comprising:
    cooling access openings being defined by the enclosure, the cooling access openings providing ingress and egress for cooling conduits passing through the cooling access openings for providing a cooling fluid to the heat sink.

14. The enclosure of claim 10, wherein the enclosure includes a removable front panel.

\* \* \* \* \*

UNITED STATES PATENT AND TRADEMARK OFFICE
CERTIFICATE OF CORRECTION

PATENT NO. : 8,462,487 B2
APPLICATION NO. : 12/949355
DATED : June 11, 2013
INVENTOR(S) : Derek Matthews et al.

Page 1 of 1

It is certified that error appears in the above-identified patent and that said Letters Patent is hereby corrected as shown below:

Title Page, Item (73) Assignee should read:

(73) Assignee: BAE Systems Controls Inc., Johnson City, NY (US)

Signed and Sealed this
Sixteenth Day of July, 2013

Teresa Stanek Rea
*Acting Director of the United States Patent and Trademark Office*